United States Patent
Do et al.

(10) Patent No.: US 7,701,790 B2
(45) Date of Patent: Apr. 20, 2010

(54) SEMICONDUCTOR MEMORY DEVICE INCLUDING RESET CONTROL CIRCUIT

(75) Inventors: Chang-Ho Do, Kyoungki-do (KR); Yong-Ki Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/528,642

(22) Filed: Sep. 28, 2006

(65) Prior Publication Data

US 2007/0070727 A1   Mar. 29, 2007

(30) Foreign Application Priority Data

Sep. 29, 2005   (KR) .................. 10-2005-0090914
May 30, 2006   (KR) .................. 10-2006-0049002

(51) Int. Cl.
G11C 7/00   (2006.01)
(52) U.S. Cl. .................. 365/203; 365/222; 365/191
(58) Field of Classification Search .................. 365/203, 365/222, 191
See application file for complete search history.

(56) References Cited

U.S. PATENT DOCUMENTS 4,334,295 A * 6/1982 Nagami .................. 365/222
5,039,875 A   8/1991 Chang
5,600,605 A   2/1997 Schaefer
6,690,220 B2   2/2004 Kuboshima et al.
6,914,461 B2   7/2005 Kwon
7,019,417 B2   3/2006 Kang
2004/0071139 A1   4/2004 Burnett
2005/0190627 A1   9/2005 Nakatake et al.

FOREIGN PATENT DOCUMENTS

| JP | 08-111089 | 4/1996 |
|---|---|---|
| JP | 10-149679 A | 6/1998 |
| JP | 2002-008371 | 1/2002 |
| JP | 2002-84176 A | 3/2002 |
| JP | 2003-030984 | 1/2003 |

OTHER PUBLICATIONS

Taiwanese Search Report and Office Action, w/ English translation thereof, issued in Taiwanese Patent Application No. 095136317 dated on Oct. 22, 2008.

* cited by examiner

Primary Examiner—Hoai V Ho
Assistant Examiner—Kretelia Graham
(74) Attorney, Agent, or Firm—IP & T Law Frim PLC

(57) ABSTRACT

A semiconductor memory device for use in a system includes a reset signal generator for generating a reset entry signal and a reset exit signal respectively in response to a start timing and a termination timing of a reset operation of the system; and a reset controller for performing a precharge operation in response to the reset entry signal and a refresh operation in response to the reset exit signal.

18 Claims, 2 Drawing Sheets

SEMICONDUCTOR MEMORY DEVICE INCLUDING RESET CONTROL CIRCUIT

FIELD OF THE INVENTION

The present invention relates to a semiconductor memory device, and more particularly to a semiconductor memory device providing reliable operation.

DESCRIPTION OF RELATED ARTS

A system including a dynamic random access memory (DRAM) is reset when its operation has an error. The system cuts off and reapplies power to the DRAM during a reset operation. After applying the power, a predetermined delay is required for the DRAM to recover its normal function. Some DRAMs such as DDR3 DRAM include a reset pin for receiving a reset signal for resetting the system. In this case, the power is continuously supplied to the DRAM although the system is in a reset state and, therefore, it is possible to reduce the predetermined delay.

FIG. 1 is a block diagram of a conventional command generator for use in a semiconductor memory device.

The command generator includes an input buffer 10, a command decoder 20, a row address strobe (RAS) signal generator 30, and a self precharge unit 40. The input buffer 10 receives external control signals /RAS and /CAS in synchronism with a clock CLK. The command decoder 20 decodes outputs of the input buffer 10 and generates an active signal RACTP, a refresh signal REFP, and a precharge signal PCGP. The self precharge unit 40 outputs a self precharge enable signal SPCG based on the refresh signal REFP. The RAS signal generator 30, receiving the outputs RACTP, REFP, and PCGP of the command decoder 20 and the self precharge enable signal SPCG, generates an active state signal OUT. The active state signal OUT is activated when the DRAM is in an active state. That is, the active state signal OUT is active when the active signal RACTP or the refresh signal REFP is activated. The active state signal OUT is inactivated when the precharge signal PCGP is activated. Further, the active state signal OUT is inactivated in response to the self precharge enable signal SPCG, which is activated after a predetermined delay added to activation of the refresh signal REFP.

The command generator shown in FIG. 1 generates the active state signal OUT without regard to a reset signal. Meanwhile, the system enters and exits to or from the reset state without regard to an operation state of the DRAM. If the system enters the reset state when the DRAM is in the active state, the DRAM can not receive any valid commands and is stuck in the active state. In this case, the DRAM is not able to perform its function even after the system exits from the reset state. Thus, it is required for the DRAM to be reset when the system is in the reset state.

SUMMARY OF THE INVENTION

Embodiments of the present invention are directed to a semiconductor memory device including a reset control circuit for controlling its operation in response to a reset operation of a system using the semiconductor memory device.

In accordance with an aspect of the present invention, a semiconductor memory device includes: a reset signal generator for generating a reset entry signal and a reset exit signal respectively in response to a start timing and a termination timing of a reset operation of the system; and a reset controller for performing a precharge operation in response to the reset entry signal and outputting a refresh operation in response to the reset exit signal.

In accordance with another aspect of the present invention, a semiconductor memory device includes: a command decoder for decoding input commands; a control signal generator for generating control signals for a data access based on outputs of the command decoder; and a reset block for preventing the data access and performing a precharge operation and a refresh operation in response to a reset signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
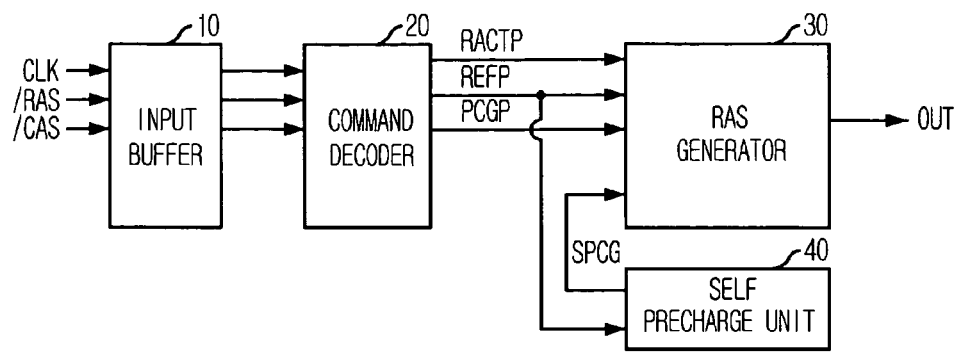
FIG. 1 is a block diagram of a conventional command generator for use in a semiconductor memory device.
Figure 2:
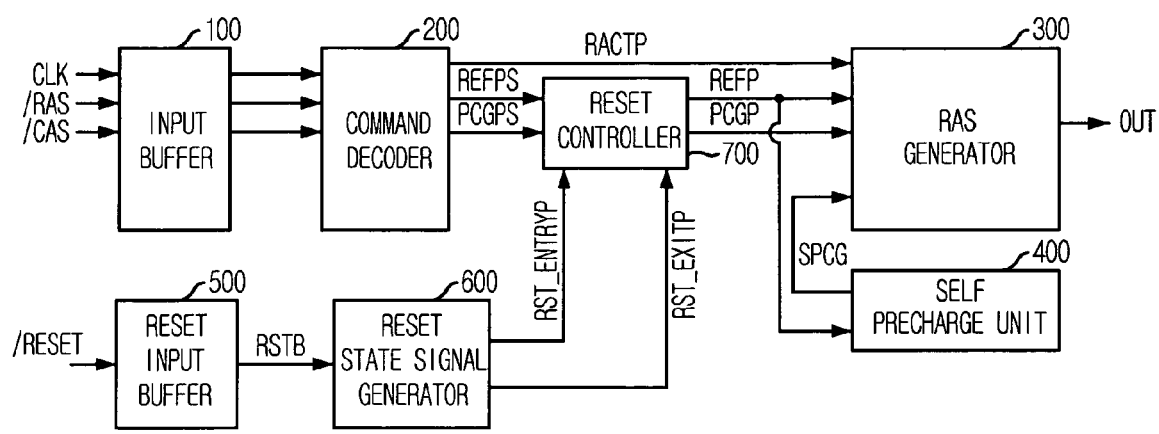
FIG. 2 is a block diagram of a command generator in accordance with an embodiment of the present invention.

FIG. 2 is a block diagram describing a command generator in accordance with an embodiment of the present invention.

The command decoder includes an input buffer 100, a command decoder 200, a row address strobe (RAS) signal generator 300, a self precharge unit 400, a reset input buffer 500, a reset state signal generator 600, and a reset controller 700. The input buffer 100 receives external control signals /RAS and /CAS in synchronism with a clock CLK. The command decoder 200 decodes outputs of the input buffer 100 and generates an active signal RACTP, an initial refresh signal REFPS, and an initial precharge signal PCGPS. The reset input buffer 500 receives a reset signal /RESET and outputs an initial reset control signal RSTB. The reset state signal generator 600 generates a reset entry signal RST_ENTRYP and a reset exit signal RST_EXITP based on the initial reset control signal RSTB. The reset entry signal RST_ENTRYP and the reset exit signal RST_EXITP respectively has information about a reset start timing and a reset termination timing of a system using the semiconductor memory device. The reset controller 700 receiving the initial refresh signal REFPS and the initial precharge signal PCGPS outputs a refresh signal REFP and a precharge signal PCGP in response to the reset entry signal RST_ENTRYP and the reset exit signal RST_EXITP. The self precharge unit 400 outputs a self precharge enable signal SPCG based on the refresh signal REFP. The RAS signal generator 300 receiving the active signal RACTP, the refresh signal REFP, the precharge PCGP, and the self precharge enable signal SPCG generates an active state signal OUT.

Figure 3:
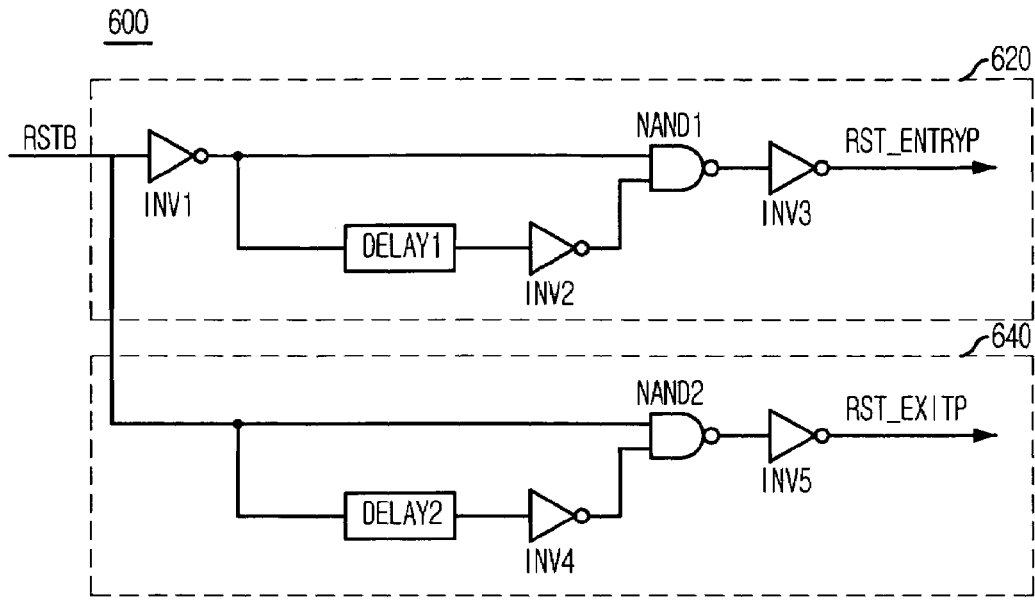
FIG. 3 is a schematic circuit diagram of a reset state signal generator shown in FIG. 2.

FIG. 3 is a schematic circuit diagram depicting the reset state signal generator shown in FIG. 2.

The reset state signal generator 600 includes a reset entry signal generator 620 and a reset exit signal generator 640. The reset entry signal generator 620 includes three inverters INV1 to INV3, a first NAND gate NAND1, and a first delay DELAY1. The first inverter INV1 inverts the initial reset control signal RSTB. The first delay DELAY1 delays an inverted initial reset control signal output from the first inverter INV1. The second inverter INV2 inverts an output of the first delay DELAY1. The first NAND gate NAND1 logically combines the inverted initial reset control signal RSTB and an output of the second inverter INV2. The third inverter INV3 inverts an output of the first NAND gate NAND1 as the reset entry signal RST_ENTRYP. The reset exit signal generator 640 includes two inverters INV4 and INV5, a second delay DELAY2, and a second NAND gate NAND2. The second delay DELAY2 delays the initial reset control signal RSTB. The fourth inverter INV4 inverts an output of the second delay DELAY2. The second NAND gate NAND2 logically combines the initial reset control signal RSTB and an output of the fourth inverter INV4. The fifth inverter inverts an output of the second NAND gate NAND2 and outputs as the reset exit signal RST_EXITP.

Figure 4A:
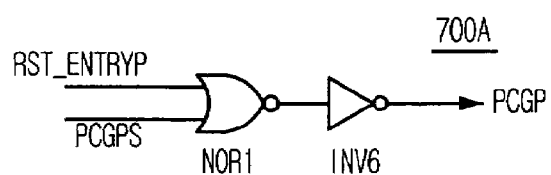
FIGS. 4A and 4B are schematic circuit diagrams of a reset controller shown in FIG. 2.
Figure 4B:
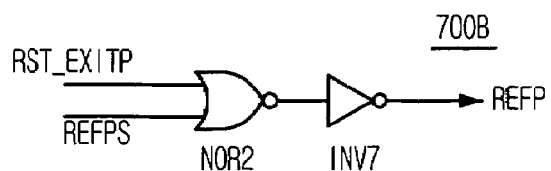

FIGS. 4A and 4B are schematic circuit diagrams showing the reset controller shown in FIG. 2.

The reset controller 700 includes a precharge signal generator 700A shown in FIG. 4A and a refresh signal generator 700B shown in FIG. 4B. The precharge signal generator 700A includes a first NOR gate NOR1 and a sixth inverter INV6. The first NOR gate NOR1 logically combines the reset entry signal RST_ENTRYP and the initial precharge signal PCGS. The sixth inverter INV6 inverts an output of the first NOR gate NOR1 and outputs the precharge signal PCGP. The precharge signal PCGP is activated in response to an activation of the reset entry signal RST_ENTRYP without regard to a state of the initial precharge signal PCGS. The refresh signal generator 700B includes a second NOR gate NOR2 and a seventh inverter INV7. The second NOR gate NOR2 logically combines the reset exit signal RST_EXITP and the initial refresh signal REFPS. The seventh inverter INV7 inverts an output of the second NOR gate NOR2 and outputs the refresh signal REFP. The refresh signal REFP is activated in response to an activation of the reset exit signal RST_EXITP without regard to a state of the initial refresh signal REFPS.

As above described, the present invention detects a starting timing and a termination timing of the reset operation by using the reset state signal generator 600 and controls a refresh operation and a precharge operation in response to the reset operation by using the reset controller 700. Therefore, the present invention provides a better performance compared with the conventional art which does not including a circuit for controlling its operation in response to the reset operation.

In the abovementioned embodiment, the logic circuits used in the reset state signal generator 600 and the reset controller 700 are arranged for input and output signals which are activated as a logic high level. Alternatively, the internal circuitry of the present invention can be changed in accordance with an active logic level of the input and output signals. In addition, the present invention can be implemented with any kind of circuitry which performs a precharge operation in response to a starting timing of the reset operation and performs a refresh operation in response to a termination timing of the reset operation. Furthermore, the reset controller of the present invention can be implemented to only control the refresh operation because the precharge operation is automatically performed while performing the refresh operation.

The present invention includes a reset control circuit for controlling an operation of a semiconductor memory device in response to a reset operation of a system using the semiconductor memory device. Therefore, it is possible for the present invention to improve the reliability and stability of the operation of the semiconductor memory device itself and the system including it.

The present application contains subject matter related to Korean patent application Nos. 2005-90914 and 2006-49002, filed in the Korean Patent Office on Sep. 29, 2005 and on May 30, 2006, the entire contents of which is incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a reset signal generator for receiving a reset signal of a system using the semiconductor memory device and generating a reset entry signal and a reset exit signal respectively in response to the reset signal of the system using the semiconductor memory device, wherein the reset entry signal and the reset exit signal include information for a start timing and a termination timing of a reset operation of the system using the semiconductor memory device, respectively, and the reset signal is used in the reset operation of the system; and
    a reset controller for performing a precharge operation in response to the reset entry signal and a refresh operation in response to the reset exit signal.

2. The semiconductor memory device as recited in claim 1, wherein the reset signal generator includes:
    an input buffer for receiving a reset enable signal preventing a data access during a predetermined period; and
    a reset state signal generator for generating the reset entry signal and the reset exit signal in response to an output of the input buffer.

3. The semiconductor memory device as recited in claim 2, wherein the reset state signal generator includes:
    a reset entry signal generator for generating the reset entry signal; and
    a reset exit signal generator for generating the reset exit signal.

4. The semiconductor memory device as recited in claim 3, wherein the reset entry signal generator includes:
    a first inverter for inverting the output of the input buffer;
    a delay for delaying an output of the first inverter;
    a second inverter for inverting an output of the delay;
    a NAND gate for logically combining the output of the first inverter and an output of the second inverter; and
    a third inverter for inverting an output of the NAND gate to thereby output the reset entry signal.

5. The semiconductor memory device as recited in claim 3, wherein the reset exit signal generator includes:
    a delay for delaying the output of the input buffer;
    a first inverter for inverting an output of the delay;
    a NAND gate for logically combining the output of the delay and an output of the first inverter; and
    a second inverter for inverting an output of the NAND gate to thereby output the reset exit signal.

6. The semiconductor memory device as recited in claim 1, wherein the reset controller includes:
    a precharge signal generator for generating a precharge signal used for the precharge operation; and
    a refresh signal generator for generating a refresh signal used for the refresh operation.

7. The semiconductor memory device as recited in claim 6, wherein the precharge signal generator includes:
    a first NOR gate for logically combining the reset entry signal and an initial precharge signal; and
    a first inverter for inverting an output of the first NOR gate to thereby output the precharge signal,
    wherein the initial precharge signal is generated by decoding external control signals.

8. The semiconductor memory device as recited in claim 7, wherein the refresh signal generator includes:
- a second NOR gate for logically combining the reset exit signal and an initial refresh signal; and
- a second inverter for inverting an output of the second NOR gate to thereby output the refresh signal,
- wherein the initial refresh signal is generated by decoding the external control signals.

9. A semiconductor memory device, comprising:
- a command decoder for decoding input commands;
- a control signal generator for generating control signals for a data access based on outputs of the command decoder; and
- a reset block for preventing the data access and performing a precharge operation and a refresh operation in response to a reset entry signal and a reset exit signal according to a reset signal received from a system using the semiconductor device, wherein the reset entry signal and the reset exit signal include information for a start timing and a termination timing of a reset operation of the system using the semiconductor memory device, respectively, and the reset signal is used in the reset operation of the system.

10. The semiconductor memory device as recited in claim 9, wherein the reset block includes:
- an input buffer for receiving a reset enable signal preventing a data access during a predetermined period; and
- a reset state signal generator for generating the reset entry signal and the reset exit signal in response to an output of the input buffer.

11. The semiconductor memory device as recited in claim 10, wherein the reset state signal generator includes:
- a reset entry signal generator for generating the reset entry signal; and
- a reset exit signal generator for generating the reset exit signal.

12. The semiconductor memory device as recited in claim 11, wherein the reset entry signal generator includes:
- a first inverter for inverting the output of the input buffer;
- a delay for delaying an output of the first inverter;
- a second inverter for inverting an output of the delay;
- a NAND gate for logically combining the output of the first inverter and an output of the second inverter; and
- a third inverter for inverting an output of the NAND gate to thereby output the reset entry signal.

13. The semiconductor memory device as recited in claim 11, wherein the reset exit signal generator includes:
- a delay for delaying the output of the input buffer;
- a first inverter for inverting an output of the delay;
- a NAND gate for logically combining the output of the delay and an output of the first inverter; and
- a second inverter for inverting an output of the NAND gate to thereby output the reset exit signal.

14. The semiconductor memory device as recited in claim 9, wherein the control signal generator includes:
- a reset controller for generating a precharge signal in response to the reset entry signal and a refresh signal in response to the reset exit signal;
- a self precharge unit for generating a self precharge enable signal based on the refresh signal; and
- a row address strobe (RAS) signal generator for generating a RAS signal in response to the precharge signal, the refresh signal and the self precharge enable signal.

15. The semiconductor memory device as recited in claim 14, wherein the reset controller includes:
- a precharge signal generator for generating a precharge signal used for the precharge operation; and
- a refresh signal generator for generating a refresh signal used for the refresh operation.

16. The semiconductor memory device as recited in claim 15, wherein the precharge signal generator includes:
- a first NOR gate for logically combining the reset entry signal and an initial precharge signal; and
- a first inverter for inverting an output of the first NOR gate to thereby output the precharge signal,
- wherein the initial precharge signal is generated by decoding external control signals.

17. The semiconductor memory device as recited in claim 16, wherein the refresh signal generator includes:
- a second NOR gate for logically combining the reset exit signal and an initial refresh signal; and
- a second inverter for inverting an output of the second NOR gate to thereby output the refresh signal,
- wherein the initial refresh signal is generated by decoding the external control signals.

18. The semiconductor memory device as recited in claim 9, wherein the command decoder performs a decoding of addresses and commands relating to a row data access.

* * * * *